(12) United States Patent
Yang et al.

(10) Patent No.: US 10,475,988 B2
(45) Date of Patent: Nov. 12, 2019

(54) HIGH EFFICIENCY SPIN TORQUE SWITCHING USING A FERRIMAGNET

(71) Applicant: National University of Singapore, Singapore (SG)

(72) Inventors: Hyunsoo Yang, Singapore (SG); Rahul Mishra, Singapore (SG); Jiawei Yu, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 15/656,848

(22) Filed: Jul. 21, 2017

(65) Prior Publication Data

US 2018/0033956 A1 Feb. 1, 2018

(30) Foreign Application Priority Data

Jul. 27, 2016 (SG) .......................... 10201606203Q

(51) Int. Cl.
| | | |
|---|---|---|
| *G11C 11/00* | (2006.01) | |
| *H01L 43/10* | (2006.01) | |
| *H01L 43/08* | (2006.01) | |
| *G11C 11/16* | (2006.01) | |
| *G11C 11/18* | (2006.01) | |
| *H01F 10/32* | (2006.01) | |

(52) U.S. Cl.
CPC ............ *H01L 43/10* (2013.01); *G11C 11/161* (2013.01); *G11C 11/165* (2013.01); *G11C 11/1675* (2013.01); *G11C 11/18* (2013.01); *H01F 10/329* (2013.01); *H01L 43/08* (2013.01); *H01F 10/3222* (2013.01)

(58) Field of Classification Search
CPC .................................................... G11C 11/161
USPC ........................................................... 365/158
See application file for complete search history.

(56) References Cited

U.S. PATENT DOCUMENTS

| | | | |
|---|---|---|---|
| 8,687,415 B2 | 4/2014 | Parkin et al. | |
| 8,742,518 B2 | 6/2014 | Wang et al. | |
| 9,025,371 B1 | 5/2015 | Huai et al. | |
| 9,691,458 B2* | 6/2017 | Ralph | G11C 11/18 |
| 2003/0063491 A1* | 4/2003 | Ikeda | B82Y 25/00 |
| | | | 365/158 |
| 2007/0074317 A1* | 3/2007 | Pakala | B82Y 25/00 |
| | | | 257/108 |

(Continued)

OTHER PUBLICATIONS

Finley, J., et al., "Spin-Orbit Torque Efficiency in Compensated Ferrimagnetic Cobalt-Terbium Alloys," Physical Review Applied, 6, 54001, Oct. 2016, pp. 1-14.

(Continued)

*Primary Examiner* — Hoai V Ho
(74) *Attorney, Agent, or Firm* — Cesari and McKenna, LLP; James A. Blanchette

(57) ABSTRACT

In one embodiment, a spin torque device uses a thick (e.g., >1 nm, and preferably >=2-6 nm) ferrimagnet (FIM) layer, instead of a thin (e.g., <1-2 nm) FM layer in the device's stack. The FIM layer may be composed of a cobalt-gadolinium (Co—Gd) alloy, cobalt-terbium (Co—Tb) multilayers, or other materials that provide anti-ferromagnetic coupling between two sub-lattices. Negative exchange interaction between the two sub-lattices of the FIM may allow for low current switching. High thermal stability and external magnetic field resistance may also be achieved.

19 Claims, 8 Drawing Sheets

(56) References Cited

U.S. PATENT DOCUMENTS

| | | | | |
|---|---|---|---|---|
| 2012/0020152 | A1* | 1/2012 | Gaudin | G11C 11/18 |
| | | | | 365/171 |
| 2015/0200003 | A1* | 7/2015 | Buhrman | G11C 11/18 |
| | | | | 365/158 |
| 2015/0303373 | A1 | 10/2015 | Chen et al. | |
| 2015/0372222 | A1 | 12/2015 | Gajek et al. | |
| 2016/0225424 | A1 | 8/2016 | Qiu et al. | |
| 2016/0276006 | A1* | 9/2016 | Ralph | G11C 11/18 |
| 2017/0200486 | A1 | 7/2017 | Qiu et al. | |
| 2017/0249981 | A1* | 8/2017 | Nebashi | G11C 11/15 |
| 2018/0040357 | A1* | 2/2018 | Shirotori | G11C 11/161 |

OTHER PUBLICATIONS

U.S. Appl. No. 15/458,196, filed Mar. 14, 2017 by Jungbum Yoon, et al. For a Techniques to Improve Switching Probability and Switching Speed in SOT Devices, pp. 1-52.

Ichimura, M., et al., " Spin Transfer Torque in MTJs with Synthetic Ferrimagnetic Layers by the Keldysh Approach," American Institute of Physics, Journal of Applied Physics, vol. 109, Mar. 23, 2011, pp. 1-4.

Jabeur, K., et al, "Study of Spin Transfer Torque (STT) and Spin Orbit Torque (SOT) Magnetic Tunnel Junctions (MTJS) at Advanced CMOS Technology Nodes," Electrical and Electronics Engineering: An International Journal (ELELIJ), vol. 6, No. 1, Feb. 2017, pp. 1-9.

Kurt, H., et al., "$Mn_{3-x}Ga$ ($0 \leq x \leq 1$): Multifunctional Thin Film Materials for Spintronics and Magnetic Recording," Wiley-VCH Verlag GmbH & Co. KGaA, Weinheim, Wiley Online Library, Physica Status Solidi B, vol. 248, No. 10, Apr. 18, 2011, pp. 2338-2011.

Lotze, Johannes R. K., "Spin Pumping in Ferrimagnet/Normal Metal Bilayers," Technische Universität München,TUM: The Entrepreneurial University, Dissertation, Jul. 2, 2015, pp. 1-134.

Roschewsky, Niklas, et al., "Spin-Orbit Torques in Ferrimagnetic GdFeCo Alloys," Applied Physics Letters, vol. 109, Issue 11, May 31, 2016, pp. 1-4.

* cited by examiner

FIG 4A
FIG. 4B
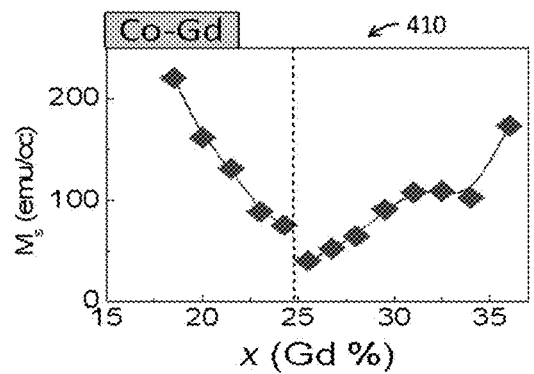
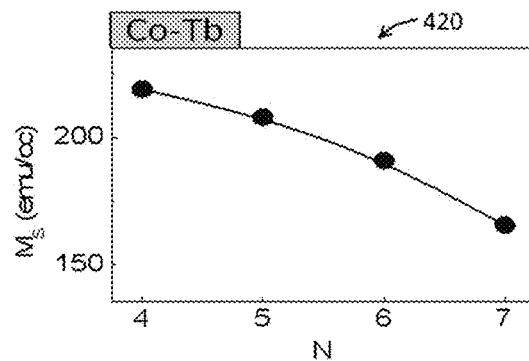

ized as a stack that includes a ferromagnet (FM) layer. For example, a typical SOT device stack includes a thin (e.g., <1 nm) FM layer (e.g., a layer of nickel-cobalt (Ni—Co) or other ferromagnetic material) adjacent a heavy metal (HM) layer (e.g., a layer of tantalum (Ta), platinum (Pt), or other metal). When an in-plane input current is applied to the SOT device, a spin current from the HM layer diffuses into the FM layer and influences the magnetization direction of the FM. Likewise, in a typical STT device, spin polarized electrons, which influence the magnetization of a FM layer, are generally supplied by another FM layer. Such influence may reverse the magnetization direction, effectively "switching" the SOT device or STT device.

HIGH EFFICIENCY SPIN TORQUE SWITCHING USING A FERRIMAGNET

RELATED APPLICATION

The present application claims priority to Singapore Patent Application No. 10201606203Q, titled High Efficiency Spin Torque Switching Using a Ferrimagnet, filed Jul. 27, 2016 by Applicant National University of Singapore, the contents of which are incorporated by reference herein in their entirety.

BACKGROUND

Technical Field

The present disclosure relates generally to spin torque devices (e.g., spin transfer torque (STT) or spin-orbit torque (SOT) devices), and more specifically, to techniques for improving thermal stability, external magnetic field resistance and switching efficiency in spin torque devices.

Background Information

Spin torque devices, such as spin torque magnetic random access memory (MRAMs), manipulate magnetization directions in a magnetic tunnel junction or spin valve to store information or for other purposes. Magnetization direction may be manipulated using current-induced STT. STT techniques have advanced over a number of years, and STT MRAMs soon will be commercially available. Magnetization manipulation may also be achieved via current-induced SOT. While not yet at the point of commercial viability, SOT MRAM may represent the future of MRAM.

Spin torque devices are typically structured as a stack that includes a ferromagnet (FM) layer. For example, a typical SOT device stack includes a thin (e.g., <1 nm) FM layer (e.g., a layer of nickel-cobalt (Ni—Co) or other ferromagnetic material) adjacent a heavy metal (HM) layer (e.g., a layer of tantalum (Ta), platinum (Pt), or other metal). When an in-plane input current is applied to the SOT device, a spin current from the HM layer diffuses into the FM layer and influences the magnetization direction of the FM. Likewise, in a typical STT device, spin polarized electrons, which influence the magnetization of a FM layer, are generally supplied by another FM layer. Such influence may reverse the magnetization direction, effectively "switching" the SOT device or STT device.

For practical applications, efforts should be put to reduce the switching current of STT and SOT devices while maintaining reasonable thermal stability and external magnetic field resistance. However, most of the work up until now generally utilize a thin (e.g., <1-2 nm) FM layer. Therefore, sufficient thermal stability and external magnetic field resistance generally have not been achieved to make the resulting devices viable under practical (i.e. real world) operational conditions. In addition, achieved switching efficiency has still been lower than desired (that is, the required switching current is still higher than desired).

Accordingly, there is a need for techniques that may improve thermal stability, external magnetic field resistance and switching efficiency in spin torque devices.

SUMMARY

Improved thermal stability, external magnetic field resistance and switching efficiency may be achieved in spin torque device by using a thick (e.g., >1 nm, and preferably >=2-6 nm) ferrimagnet (FIM) layer, instead of a thin (e.g., <1-2 nm) FM layer in the device's stack. The FIM layer may be composed of a cobalt-gadolinium (Co—Gd) alloy, cobalt-terbium (Co—Tb) multilayers, or other materials that provide anti-ferromagnetic coupling between two sub-lattices. Bulk perpendicular magnetic anisotropy (PMA) of the FIM may aid in depositing a thick film, and such thickness may provide increased thermal stability. The FIM may also be resilient to external magnetization due to its intrinsic high anisotropy, because of the negative exchange interaction between the two sub-lattices. Further, the negative exchange interaction between the two sub-lattices of the FIM may allow for low current switching. For example, an SOT device utilizing a FIM layer may be an order of magnitude (e.g., 20 times) more efficient in a traditional FM-based SOT device. The use of a FIM layer may improve the STT devices (e.g., STT MRAM) that are soon to be commercially available, and may help render SOT device (e.g., SOT MRAM) more commercially viable.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIGS. 4A and 4B are graphs showing the saturation magnetization ($M_S$) as a function of Gd composition in Co—Gd alloy, and the repetition number (N) in Co—Tb multilayers, respectively;

DETAILED DESCRIPTION OF EXAMPLE EMBODIMENTS

Figure 1A:
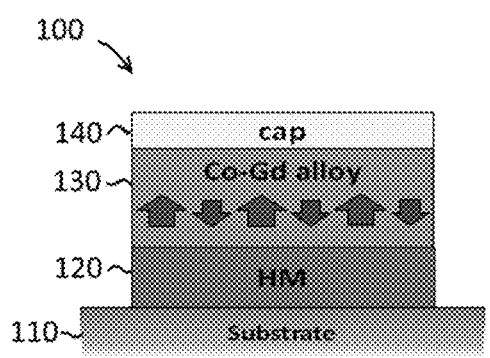
FIGS. 1A and 1B are diagrams of example spin torque devices that utilize a FIM layer.
Figure 1B:
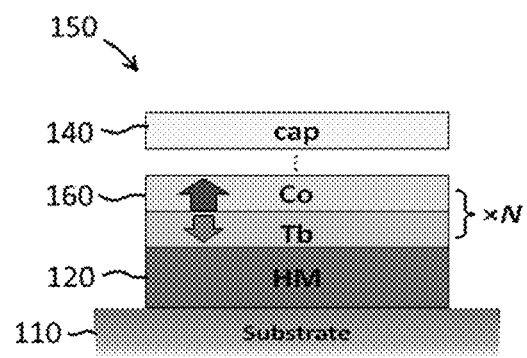

FIGS. 1A and 1B are diagrams of example spin torque devices that utilize a FIM layer 130, 160. In this and below examples, the spin torque devices take the form of SOT devices 100, 150, but it should be remembered that an FIM layer may alternatively be used in other types of spin torque devices, including STT devices. The first SOT device 100 includes a substrate 110 (e.g., thermally oxidized silicon), an HM layer 120 (e.g., 10 nm of Pt) that serves as a spin current source, a single FIM layer 130 (e.g., 6 nm thick Co—Gd alloy, for example, grown using a radio frequency (rf) and direct current (DC) magnetron sputtering system), and a capping layer 140 (e.g., of silicon oxide ($SiO_2$)). The Co and Gd concentration in the layers may be in the range of $Co_{83}Gd_{17}$ to $Co_{64}Gd_{36}$. The second SOT device 150 includes a substrate 110, an HM layer 120 (e.g., 4 nm of Pt) that serves as a spin current source, a multilayer FIM layer 160 (e.g., 0.34 nm of Tb and 0.32 nm of Co as a bilayer pair, with a repetition of the bilayer pair of number N), and a capping layer 140 (e.g., of $SiO_2$).

For comparative purposes, the SOT devices 100, 150 may be compared to a SOT device (not shown) that utilizes an FM layer. Such an example of FM-based SOT device may include a substrate, a first spacer layer (e.g., 2 nm of Magnesium Oxide (MgO)), an HM layer (e.g., 4 nm of Pt) that serves as a spin current source, a multilayer FM layer (e.g., 0.1 nm Nickel (Ni) and 0.1 nm Co as a bilayer pair, with a repetition of the bilayer pair of number N), a second spacer layer (e.g., 2 nm of MgO), and a capping layer (e.g., of $SiO_2$).

Figures 2A, 2B, 2C:
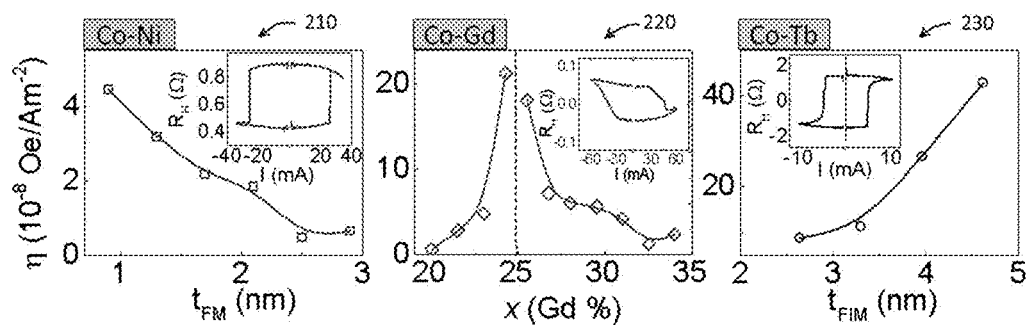
FIGS. 2A, 2B and 2C are graphs showing switching efficiencies ($\eta$) as a function of Co—Ni thickness, Co—Gd compositions, and Co—Tb thickness, respectively.

FIGS. 2A, 2B and 2C are graphs 210, 220, 230 showing switching efficiencies ($\eta$) as a function of Co—Ni thickness, Co—Gd compositions, and Co—Tb thickness, respectively. The inserts in the graphs 210, 220, 230 are hysteresis loops of current-induced switching, showing Hall resistance ($R_H$) as a function of applied DC current. As can be seen the switching efficiency has a peak value of $21 \times 10^{-8}$ Oe/$Am^{-2}$ for a device with a Co—Gd FIM and $43 \times 10^{-8}$ Oe/$Am^{-2}$ for a device with a Co—Tb multilayer FIM as shown graphs 220, 230, respectively. These values are an order of magnitude larger than that for a SOT device using a Co—Ni multilayer FM, as shown in graph 210. Even when compared to other types of FM-based SOT devices (e.g., a device employing a Pt (2 nm)/Cobalt Iron Boron alloy (CoFeB) (0.8 nm)/MgO (2 nm)/$SiO_2$ (3 nm) stack) these values are much larger (e.g., ~50 times larger).

Figures 3A, 3B, 3C:
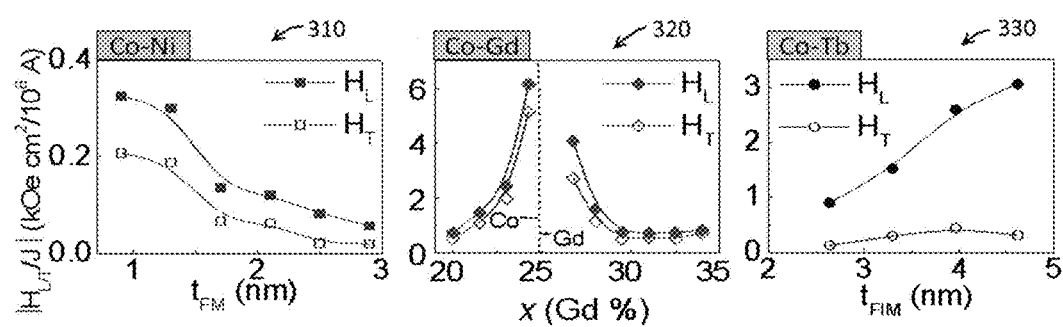
FIGS. 3A, 3B and 3C are graphs showing longitudinal ($H_L$) and transverse ($H_T$) SOT effective fields as a function of Co—Ni thickness, Co—Gd compositions, and Co—Tb thickness, respectively.

FIGS. 3A, 3B and 3C are graphs 310, 320, 330 showing longitudinal ($H_L$) and transverse ($H_T$) SOT effective fields as a function of Co—Ni thickness, Co—Gd compositions, and Co—Tb thickness, respectively. SOT effective fields are directly correlated with the switching efficiency. The longitudinal effective field has a peak value of 6.1 kOe and 3 kOe per $10^8$ $Acm^{-2}$ of current density for a device using a Co—Gd FIM and Co—Tb multilayer FIM, respectively. For a SOT device using a Co—Ni multilayer FM the $H_L$ value is only 0.3 kOe per $10^8$ $Acm^{-2}$ as shown in graph 310. Other FM-based SOT devices (e.g., devices employing a Pt (3 nm)/Co (0.9 nm)/Ta (4 nm) or Ta (3 nm)/CoFeB (0.9 nm)/MgO (2 nm) stack) have $H_L$ value around 20 to 50 times smaller compared to FIM-based SOT devices when normalized by the used thickness.

FIGS. 4A and 4B are graphs 410, 420 showing the saturation magnetization ($M_S$) as a function of Gd composition in Co—Gd alloy, and the repetition number (N) in Co—Tb multilayers, respectively. The increase in $\eta$ and $H_L$ are more noticeable when the FIM approaches compensation (i.e. when the net magnetic moment approaches zero). As shown by graph 220 in FIG. 2B and graph 410 in FIG. 4A, for the case of a Co—Gd FIM the peak value of $\eta$ is obtained near the magnetic compensation point. Similarly, as shown in graph 230 in FIG. 2C and graph 420 in FIG. 4B, for the Co—Tb multilayer FIM, the peak value of $\eta$ is for the higher repetition number of the multilayer when the net magnetic moment is less due to more compensation.

Figures 5A, 5B, 5C:
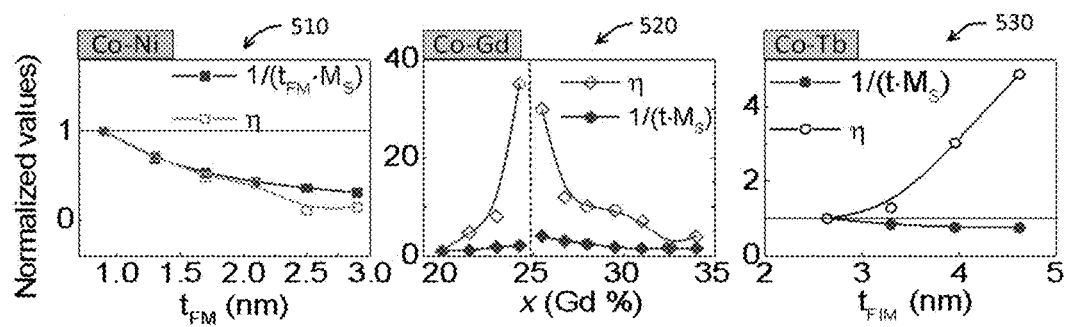
FIGS. 5A, 5B and 5C are graphs showing normalized values of $\eta$ and $1/(M_S \cdot t)$, where t is thickness of the magnetic layer, in SOT devices employing a Co—Ni multilayer FM, a Co—Gd FIM, and Co—Tb multilayer FIM, respectively.

FIGS. 5A, 5B and 5C are graphs 510, 520, 530 showing normalized values of $\eta$ and $1/(t \cdot M_S)$, where t is thickness of the magnetic layer, in SOT devices employing a Co—Ni multilayer FM, a Co—Gd FIM, and Co—Tb multilayer FIM, respectively. The horizontal lines represent normalized values equaling to 1, corresponding to the first data points in the graphs. As can be seen from the graphs 510, 520, 530, switching efficiency in SOT devices using FIMs is superior to SOT devices using traditional FMs. As predicted by the spin Hall theory, $\eta$ should scale with $1/(M_S t)$ as we see in graph 510 of FIG. 5A for a SOT device employing a Co—Ni multilayer FM. However, for the case of a device employing a Co—Gd FIM in graph 520 of FIG. 5B, it is observed that $\eta$ does not scale with $1/(t \cdot M_S)$. Further, for the case of a device employing a Co—Tb multilayer FIM, as show in graph 530 of FIG. 5C, as t increases, $\eta$ increases dramatically in spite of the decrease of $1/(t \cdot M_S)$. Therefore, the increment of $\eta$ with respect to the t does not attribute to the variations of $M_S$ nor t. It may be seen that a mechanism apart from SOTs assists the current induced switching as the FIM approaches its compensation. Namely, the switching of FIM-based SOT devices is assisted by the negative exchange interaction torque apart from the normal SOTs.

Figure 6A:
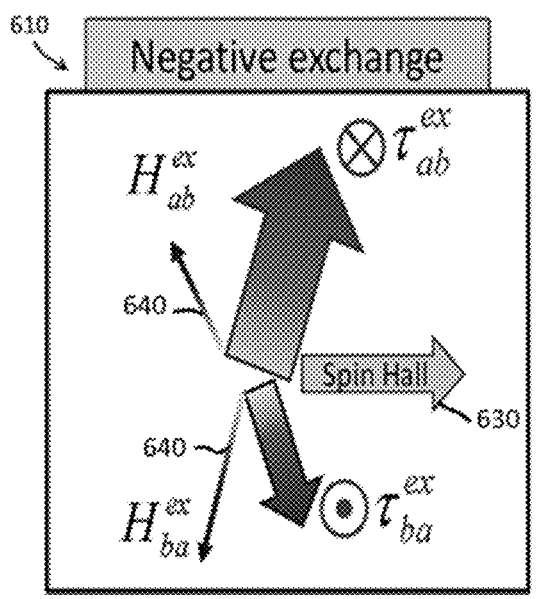
FIGS. 6A and 6B are schematic representations of the exchange fields ($H_{ex}$) and the corresponding exchange torques ($\tau_{ex}$) for two sub-lattices with negative and positive exchange interaction, respectively.
Figure 6B:
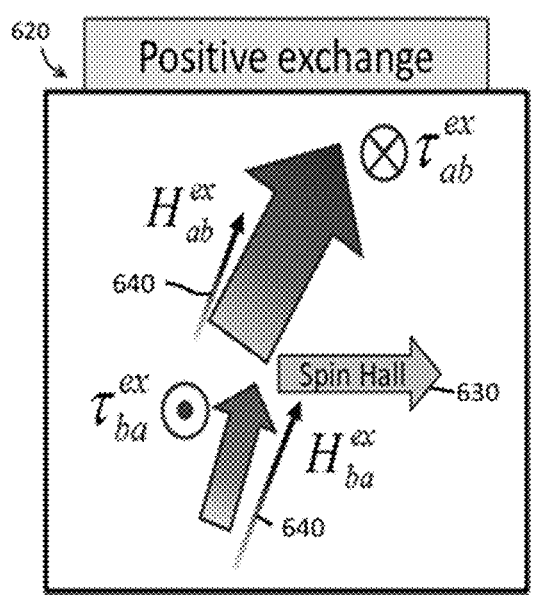

FIGS. 6A and 6B are schematic representations 610, 620 of the exchange fields ($H_{ex}$) and the corresponding exchange torques ($\tau_{ex}$) for two sub-lattices with negative and positive exchange interaction, respectively. As a FIM approaches compensation, the exchange interaction between the sub-lattices increases. This negative exchange interaction provides additional torque in current induced switching of a FIM. For the case of negative exchange interaction shown in FIG. 6A, the sub-lattices are coupled antiferromagnetically, while for the case of positive exchange interaction shown in FIG. 6B they are coupled ferromagnetically. During switching, when a current is applied in the heavy metal along the positive x direction, due to the spin Hall effect (SHE) the spin accumulates and diffuses in the magnet, thereby applying anti-damping or spin Hall torque as shown by the arrows 630 in FIGS. 6A and 6B. The SHE tilts the two magnetic sub-lattices in the direction of the torque (i.e. along the y direction), making them non-collinear. Once in the non-collinear state the two sub-lattices are acted upon by an additional exchange field ($H_{ba}^{ex}$, $H_{ab}^{ex}$; the subscript 'ba' indicating exchange field due to 'b' acting on 'a', and vice versa), highlighted by the arrows 640. This exchange field due to exchange interaction produces an additional torque which is deemed the exchange interaction torque ($\tau_{ba}^{ex}$, $\tau_{ab}^{ex}$) and the direction of which for the different sub-lattices is shown. For both cases shown in FIGS. 6A and 6B, $\tau^{ex}$ acts in the opposite direction on the two sub-lattices. For the case of anti-ferromagnetic coupling shown in FIG. 6A, the $\tau^{ex}$ acting in the opposite direction for sub-lattices A and B, aids the switching of their combined magnetic moment. However, in the case of ferromagnetic coupling shown in FIG. 6B, $\tau^{ex}$ acting in the opposite direction for the two sub-lattices does not assist in switching. If $\tau^{ex}$ were acting in the same direction for both sub-lattices A and B, it would have aided in switching. Therefore, the presence of this extra exchange interaction torque helps a FIM switch more efficiently compared to a FM. As a FIM approaches the compensation point, the torque due to exchange interaction on the dominating sub-lattice increases thereby producing a higher $\eta$ for the device.

Figure 7:
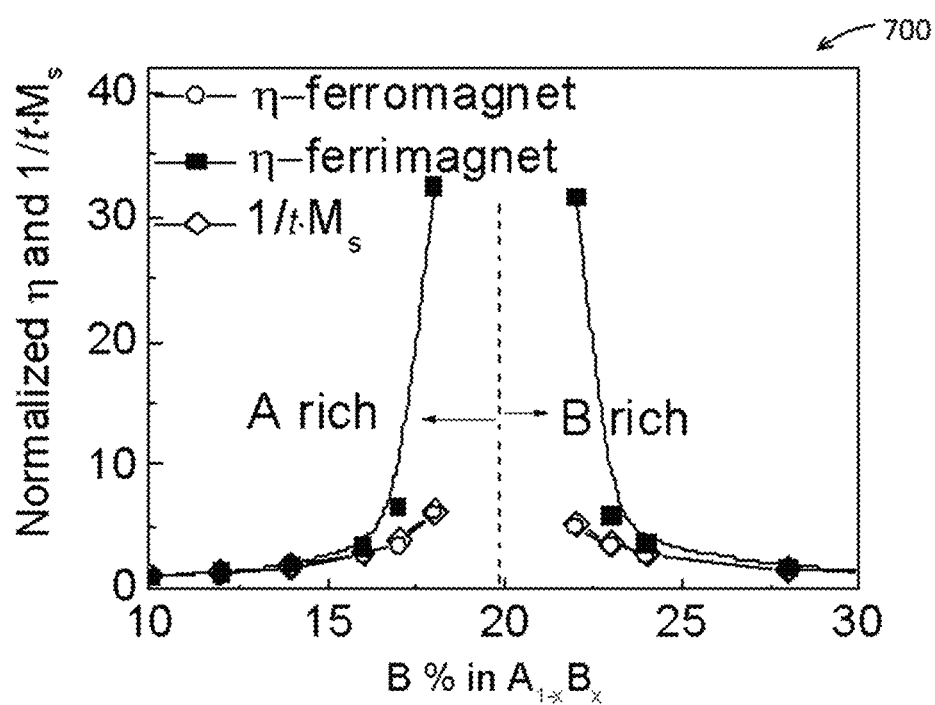
FIG. 7 is a graph showing normalized $\eta$ of a FIM compared with normalized $1/t \cdot M_S$ for different B concentration produced from 2-spin macrospin simulations.

FIG. 7 is a graph 700 showing shows normalized η of a FIM compared with normalized $1/(t \cdot M_S)$ for different B concentration produced from 2-spin macrospin simulations. The diamond symbols show normalized values of a FM with $M_S$ equivalent to that of the FIM. Values are normalized with respect to the values of $A_{90}B_{10}$. As can be seen, switching efficiency scales disproportionally to $1/(t \cdot M_S)$ near compensation. From the simulations, it is clear that a system of two sub-lattices with negative exchange interaction is more efficient for current-induced magnetization switching compared to a FM system with similar $M_S$.

Figure 8A:
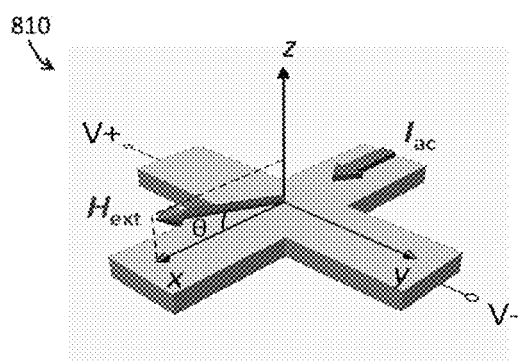
FIGS. 8A and 8B are measurement schematics for longitudinal and transverse SOT effective fields, respectively, that may illustrate how quantities such as $H_L$ and $H_T$ may be quantified.
Figure 8B:
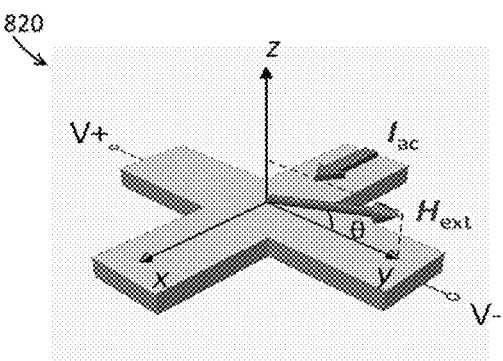

FIGS. 8A and 8B are measurement schematics 810, 820 for longitudinal and transverse SOT effective fields, respectively, that may illustrate how the quantities such as $H_L$ and $H_T$ discussed above may be quantified. An alternating current ($I_{ac}$) with a frequency of 13.7 Hz and a magnitude of 10 mA may be injected into the channel of a device. An external magnetic field ($H_{ext}$) may be applied along (orthogonal to) the current direction and kept as in plane with a small out-of-plane tilting (θ=4°) in the longitudinal (transverse) configuration. The first and second harmonic Hall voltage data may be recorded simultaneously by using two lock-in amplifiers triggered as the same frequency by the current source.

In conclusion, use of a thick (e.g., >1-2 nm, and preferably >=2-6 nm) FIM layer, instead of a thin (e.g., <1-2 nm) FM layer, in a spin torque device may improve thermal stability, external magnetic field resistance and switching efficiency. While Co—Gd alloy and Co—Tb multilayers are discussed above as examples of FIM materials that may be used, it should be understood that a wide variety of other FIM materials may be employed. Further, while SOT devices, such as SOT MRAMs, were discussed as an example of one type of spin torque device a FIM layer may be used to advantage in, it should be remembered that a FIM layer may be used to advantage in other types of spin torque devices, including STT devices, such as STT MRAMs. In general, it should be understood that a wide variety of adaptations and modifications may be made to the above-discussed techniques. It should be appreciated that details included in the various example embodiments are merely provided for purposes of illustration, and are not intended to limit the scope, applicability, or configuration of the invention. For example, it should be understood that the various elements described above may be made from differing materials, implemented in different combinations or otherwise formed or used differently without departing from the intended scope of the invention.

What is claimed is:

1. A spin-orbit torque (SOT) device arranged as a stack, comprising:
   a substrate;
   a heavy metal (HM) layer;
   a ferrimagnet (FIM) layer disposed adjacent to the heavy metal layer, the FIM layer constructed from a material that provides anti-ferromagnetic coupling between two sub-lattices, the FIM layer having a thickness greater than 1 nanometer (nm); and
   a capping layer,
   wherein the stack of the SOT device is arranged such that, when an in-plane current is applied to the HM layer of the SOT device, a spin from the HM layer diffuses into the FIM layer to produce negative exchange interaction between the two sub-lattices of the FIM layer, which provides additional torque that assists current induced SOT magnetization switching of the SOT device.

2. The SOT device of claim 1, wherein the FIM layer comprises cobalt-gadolinium (Co—Gd) or cobalt-terbium (Co—Tb) alloy.

3. The SOT device of claim 1, wherein the FIM layer is a multilayer FIM layer that comprises one or more magnetic bilayer pairs.

4. The SOT device of claim 3, wherein the one or more bilayer pairs each comprise a cobalt (Co) layer and a gadolinium (Gd) or terbium (Tb) layer.

5. The SOT device of claim 1, wherein the FIM layer has thickness a greater than or equal to 2 nm.

6. The SOT device of claim 1, wherein the FIM layer has thickness a greater than or equal to 6 nm.

7. The SOT device of claim 1, wherein the SOT device is a SOT magnetic random access memory (MRAM).

8. A spin-orbit torque (SOT) device arranged as a stack, comprising:
   a substrate;
   a heavy metal (HM) layer;
   a ferrimagnet (FIM) layer disposed adjacent to the heavy metal layer, the FIM layer constructed from a material that provides anti-ferromagnetic coupling between two sub-lattices, the FIM layer having a thickness greater than 1 nanometer (nm); and
   a capping layer,
   wherein the stack of the SOT device is arranged such that negative exchange interaction between the two sub-lattices of the FIM layer provides additional torque that assists current induced SOT magnetization switching of the SOT device.

9. The SOT device of claim 8, wherein the FIM layer comprises cobalt-gadolinium (Co—Gd) or cobalt-terbium (Co—Tb) alloy.

10. The SOT device of claim 8, wherein the FIM layer is a multilayer FIM layer that comprises one or more magnetic bilayer pairs.

11. The SOT device of claim 8, wherein the one or more bilayer pairs each comprise a cobalt (Co) layer and a gadolinium (Gd) or terbium (Tb) layer.

12. The SOT device of claim 8, wherein the FIM layer has a thickness greater than or equal to 2 nanometer (nm).

13. The SOT device of claim 8, wherein the FIM layer has a thickness greater than or equal to 6 nanometer (nm).

14. The SOT device of claim 8, wherein the spin torque device is a spin-orbit torque (SOT) magnetic random access memory (MRAM).

15. A method for switching a spin-orbit torque (SOT) device that is arranged as a stack that includes a substrate, a heavy metal (HM) layer, a ferrimagnet (FIM) layer, and a capping layer, the method comprising:
   applying an in-plane current to the HM layer;
   in response to the applied current, producing an anti-damping torque in the FIM layer that tilts two magnetic sub-lattices of the FIM causing an exchange field;
   producing a negative exchange interaction torque that acts in opposite directions on the two magnetic sub-lattices, wherein the negative exchange interaction torque assists magnetization switching of the SOT device when the in-plane current is applied.

16. The method of claim 15, wherein the FIM layer has a thickness greater than 1 nanometer (nm).

17. The method of claim 15, wherein the FIM layer has a thickness greater than or equal to 2 nanometer (nm).

18. The method of claim 15, where the SOT device is a spin-orbit torque (SOT) magnetic random access memory (MRAM).

19. The SOT device of claim 1, wherein the FIM layer has perpendicular magnetic anisotropy (PMA).

* * * * *